(12) United States Patent
Matsuura et al.

(10) Patent No.: US 6,798,056 B2
(45) Date of Patent: Sep. 28, 2004

(54) SEMICONDUCTOR MODULE HAVING AN UPPER LAYER SEMICONDUCTOR PACKAGE OVERLYING A LOWER LAYER SEMICONDUCTOR PACKAGE

(75) Inventors: Tetsuya Matsuura, Hyogo (JP); Yasushi Kasatani, Hyogo (JP); Kazunari Michii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/231,148

(22) Filed: Aug. 30, 2002

(65) Prior Publication Data

US 2003/0174481 A1 Sep. 18, 2003

(30) Foreign Application Priority Data

Mar. 13, 2002 (JP) ......................................... 2002-068248

(51) Int. Cl.⁷ .......................... H01L 23/02; H01L 23/34
(52) U.S. Cl. ....................... 257/686; 257/685; 257/777; 257/723; 257/692
(58) Field of Search ................................. 257/686, 685, 257/777, 723, 784, 676, 690, 691, 692, 693, 694, 695, 696, 666, 674, 730, 789, 684, 689

(56) References Cited

U.S. PATENT DOCUMENTS 5,754,408 A * 5/1998 Derouiche
6,424,030 B2 * 7/2002 Masayuki et al.
6,528,870 B2 * 3/2003 Fukatsu et al.

FOREIGN PATENT DOCUMENTS

| JP | 4-276649 | 10/1992 |
|---|---|---|
| JP | 6-97355 | 4/1994 |
| JP | 8-88310 | 4/1996 |
| JP | 11-40745 | 2/1999 |

* cited by examiner

Primary Examiner—Long Pham
Assistant Examiner—Dilinh Nguyen
(74) Attorney, Agent, or Firm—McDermott Will & Emery LLP

(57) ABSTRACT

A semiconductor module includes a substrate having a pad electrode on a surface, a lower layer semiconductor package mounted on the substrate, and an upper layer semiconductor package mounted on the substrate while arranged in a position substantially overlying the former. The pad electrodes connected to the leads of these semiconductor packages are arranged alternately. The lead has a dambar residual portion. An inner surface of a lead downward portion of the upper layer semiconductor package is positioned outside an outer surface of a lead downward portion of the lower layer semiconductor package.

7 Claims, 16 Drawing Sheets

SEMICONDUCTOR MODULE HAVING AN UPPER LAYER SEMICONDUCTOR PACKAGE OVERLYING A LOWER LAYER SEMICONDUCTOR PACKAGE

BACKGROUND OF THE INVENTION

1. Field of the Invention

The present invention relates to a semiconductor module such as a memory module. A "semiconductor module" herein refers to a module having one or more parts including a semiconductor package mounted on one substrate.

2. Description of the Background Art

Information equipment such as a personal computer has a memory module mounted as a semiconductor module. A common and conventional memory module will now be described. First, in FIG. 9, a semiconductor package 1 mounted on a memory module is shown. Semiconductor package 1 includes a package body 2 and a plurality of leads 3 protruding in parallel, respectively from opposing side portions. A dimension of semiconductor package 1 is determined by an organization for standardizing a semiconductor package, JEDEC (Joint Electron Device Engineering Council), and a "TSOP" (Thin Small Out-line Package) of "400 mil" is one example. When semiconductor package 1 is an SDRAM (Synchronous Dynamic Random Access Memory), 54 pins are provided, pitch A between leads 3 is set to 0.8 mm, and width B per one lead 3 is set to 0.3 mm.

As shown in FIG. 10, a memory module 100 has semiconductor package 1 mounted on a surface of substrate 4 in a prescribed arrangement. On the surface of substrate 4, in addition to semiconductor package 1, a packaged parts 5a, 5b such as a resistance, and a buffer IC (Integrated Circuit) 6 for amplifying and timing a signal of the memory are also mounted. In order to make effective use of a limited area on substrate 4, packages are often mounted on opposing surfaces of substrate 4, as shown in FIG. 11. On both surfaces of substrate 4, pads 7 are formed in positions corresponding respectively to leads 3, which are electrically connected to pads 7 respectively. In an example shown in FIGS. 10 and 11, nine semiconductor packages 1 are mounted on one surface of substrate 4 of 133.35 mm long and 31.75 mm wide, which is a dimension determined in accordance with JEDEC standard. This means that, in total, eighteen semiconductor packages 1 are mounted on both surfaces.

As personal computers and the like are more sophisticated, an increase of memory capacity has been demanded. Accordingly, more semiconductor packages need to be mounted per one substrate. In an effort to achieve this, in Japanese Patent Laying-Open No. 4-276649, a technique to stack and mount a semiconductor package is proposed. According to the technique, as shown in FIG. 12, a semiconductor package 1e having a longer lead is prepared in addition to semiconductor package 1. As shown in FIGS. 13 and 14, a two-layered structure is provided on one surface of substrate 4. That is, an inner pad 7 having a conventional arrangement and a pad 7e arranged outside the former together form pads on the surface of substrate 4. In the two-layered structure of the semiconductor packages, lead 3 of semiconductor package 1 located on a side close to substrate 4 (hereinafter, referred to as a "lower layer") is connected to pad 7, while a lead 3e of semiconductor package 1e overlying the former on a side far from substrate 4 (hereinafter, referred to as an "upper layer") relative to semiconductor package 1 is connected to pad 7e, going around the outside of lead 3. In this case, however, a row of pad 7e for upper layer semiconductor package 1e should be arranged parallel to, and outside, a row of pad 7 for lower layer semiconductor package 1. Therefore, width of the area occupied on substrate 4 will be larger. Consequently, for example, though nine semiconductor packages could conventionally be arranged per one layer on one surface of substrate 4, only eight semiconductor packages per one layer on one surface can be arranged, as can be seen in a memory module 101 shown in FIG. 15.

Further improved techniques are possible as described below. As shown in FIG. 16, a semiconductor package if is prepared, which is a 400 mil package having 54 pins in accordance with a conventional standard. Though pitch between leads 3f is the same as a conventional example, width C per one lead 3f is made smaller to 0.16 mm. This semiconductor package 1f is provided as a lower layer. Separately, a semiconductor package 1g is prepared having a lead 3g that has the same length as lead 3f when viewed from the top and has longer length than the same when viewed from the side. This package is provided as an upper layer. Width C per one lead 3g of semiconductor package 1g is also made smaller to 0.16 mm. Both packages are mounted, with one overlying the other, as shown in FIGS. 17 and 18. The pad of upper layer semiconductor package 1g and the pad of lower layer semiconductor package 1f are alternately arranged, and lead 3g of semiconductor package 1g is interposed between leads 3f of semiconductor package 1f respectively. Consequently, as can be seen in a memory module 102 shown in FIG. 19, nine packages can be arranged per one layer on one surface of substrate 4, as in a conventional example.

In FIG. 20, an enlarged view of the vicinity of a root portion of the lead is shown. Generally, a plurality of leads protruding in parallel from a side portion of a package body of the semiconductor package are manufactured in the following manner. A package body 2 portion is formed with resin mold so as to partially cover a leadframe 14 integrally formed. Thereafter, as shown in FIG. 21, a punch region 13 set on a dambar 12 linking each lead in a portion protruding from the side portion of package body 2 is punched through, and thus each lead is separated. In an attempt to punch the region to completely remove dambar 12 linking each lead, a puncher may strike a lead portion and damage the lead, or useful life of the puncher may be shortened. Therefore, usually, punch region 13 is set to a size covering only a main portion of dambar 12 with a small clearance from the lead portion, not exactly covering both full ends of dambar 12. Accordingly, as shown in FIG. 22, after punching, a dambar residual portion 8 will remain in the middle of lead 3. Lead 3 is folded thereafter, to have a shape shown in FIG. 23. In FIG. 23, the semiconductor package is shown, disposed on substrate 4. Here, the lead can be divided in three parts: a lead drawn-out portion 31 horizontally drawn from the side portion of package body 2; a lead extending-downward portion 32 hereinafter, referred to as a "lead downward portion") extending down to the surface of substrate 4; and a lead foot portion 33 for contacting pad electrode 7.

A side view of the techniques described with reference to FIGS. 16 to 19 is shown in FIG. 24. Width of the lead is made smaller in both upper and lower layers so that lead 3g of upper layer semiconductor package 1g passes a gap between leads 3f of lower layer semiconductor package 1f. In practice, however, as dambar residual portion 8 is present, the gap where lead 3g can pass is narrow. Therefore, only a slight displacement of a position of either the upper or lower semiconductor package may cause a contact of lead 3f with lead 3g.

SUMMARY OF THE INVENTION

An object of the present invention is to provide a semiconductor module capable of increasing the mountable number of semiconductor packages per one layer on one surface of a substrate as well as avoiding contacts between leads due to a dambar residual portion.

In order to achieve the object above, a semiconductor module according to the present invention includes a substrate having a pad electrode on a surface, a lower layer semiconductor package mounted on the substrate, and an upper layer semiconductor package mounted on the substrate while arranged in a position substantially overlying the lower layer semiconductor package. The lower layer semiconductor package and the upper layer semiconductor package include a package body and a plurality of leads protruding in parallel respectively from opposing side portions of the package body and electrically connected to the pad electrode. The pad electrode having the lead of the upper layer semiconductor package connected and the pad electrode having the lead of the lower layer semiconductor package connected are alternately arranged. The lead includes a lead drawn-out portion horizontally drawn from a side portion of the package body, a lead downward portion extending from the lead drawn-out portion down to a surface of the substrate and a lead foot portion continuing to a tip end of the lead downward portion and contacting the pad electrode. The lead has a dambar residual portion protruding toward the lead adjacently protruding from the same package body in any position the middle between the lead drawn-out portion and the lead downward portion. An inner surface of the lead downward portion of the upper layer semiconductor package is positioned outside an outer surface of the lead downward portion of the lower layer semiconductor package. By adopting this structure, even if slight displacement of the relative positions of upper and lower layer semiconductor packages, with one overlying the other, may occur, contact of the lead of the upper layer semiconductor package with the dambar residual portion of the lower layer semiconductor package can be prevented.

In the present invention, preferably, when viewed two-dimensionally, the pad electrode is arranged in a staggered manner so that the pad electrode connected to the upper layer semiconductor package is located outside and the pad electrode connected to the lower layer semiconductor package is located inside, with a projection region onto the substrate of the package body serving as a center. By adopting this structure, while minimizing a material for the pad electrode, a connection portion to the lead can efficiently be arranged in a limited area.

In the present invention, preferably, a horizontal distance from the package body to the dambar residual portion in the upper layer semiconductor package is substantially equal to a horizontal distance from the package body to the dambar residual portion in the lower layer semiconductor package, and the lead downward portions of the upper layer semiconductor package and the lower layer semiconductor package extend diagonally relative to the substrate. By adopting this structure, contact between the lead downward portions can be prevented, even if the lead drawn-out portions are of the same length.

In the present invention, preferably, the lead has a section including the dambar residual portion, wider than other sections. By adopting this structure, a conventional punching apparatus can be used, obviating the need of a new punching apparatus.

The present invention preferably includes a structure in which a plurality of combinations of the upper layer semiconductor package and the lower layer semiconductor package are vertically stacked. By adopting this structure, larger number of semiconductor packages can be mounted in unit area of the substrate, and a semiconductor module of high density and high performance can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
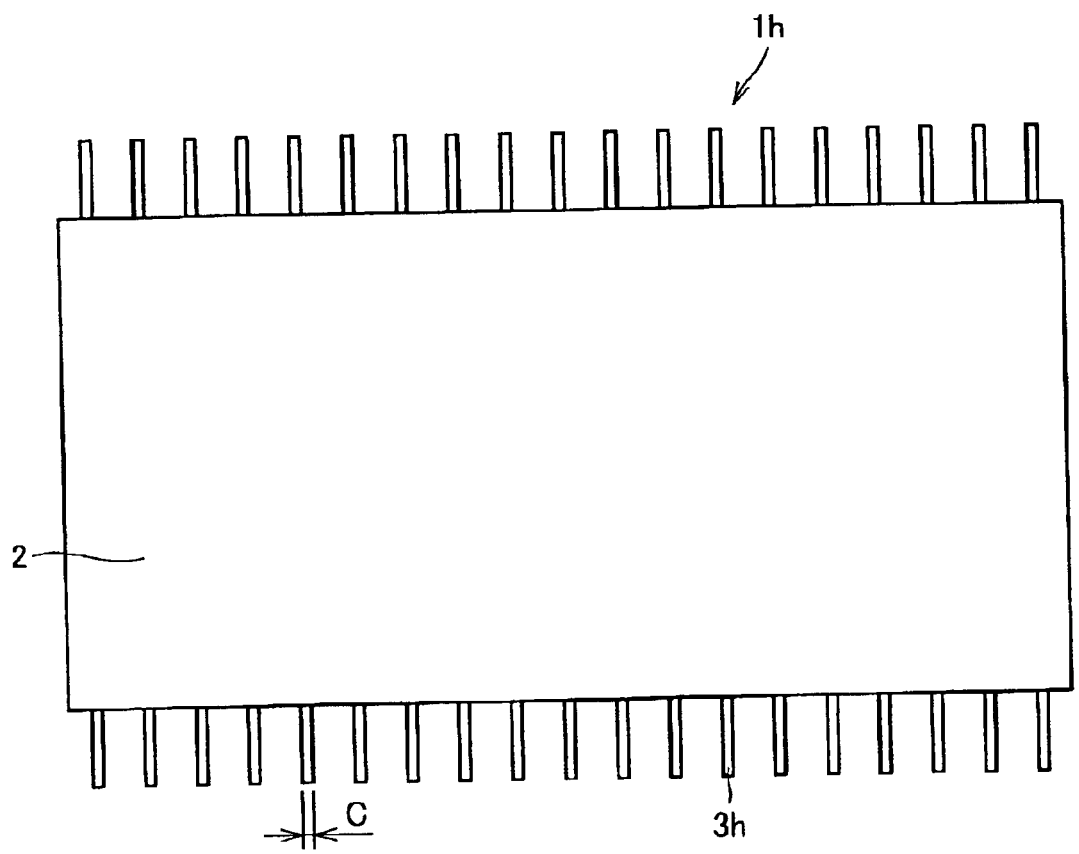
FIG. 1 is a plan view of a semiconductor package mounted on a semiconductor module in a first embodiment according to the present invention.
Figure 2:
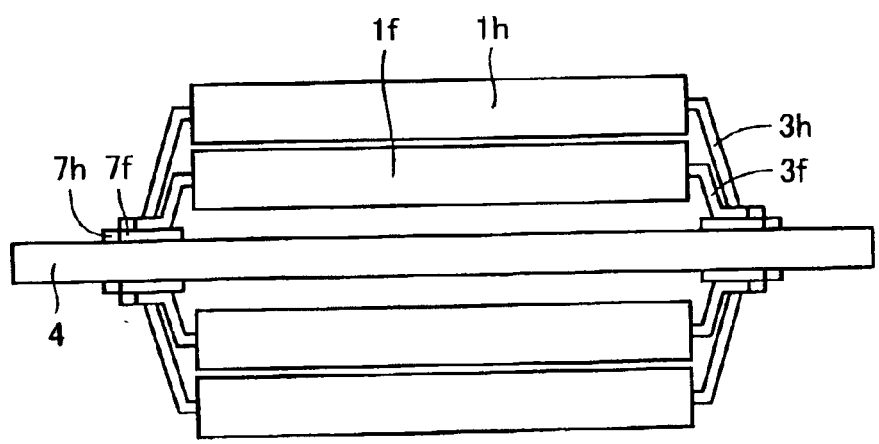
FIG. 2 is a side view of the semiconductor module in the first embodiment according to the present invention.
Figure 3:
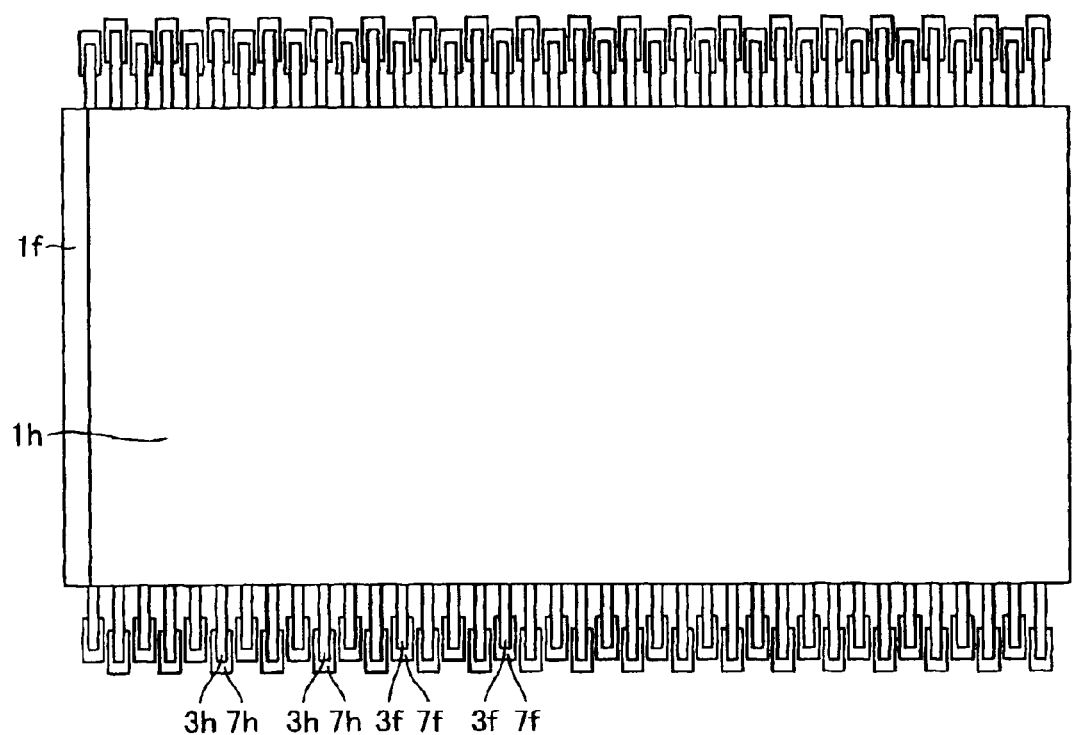
FIG. 3 is a partially enlarged plan view of the semiconductor module in the first embodiment according to the present invention.
Figure 16:
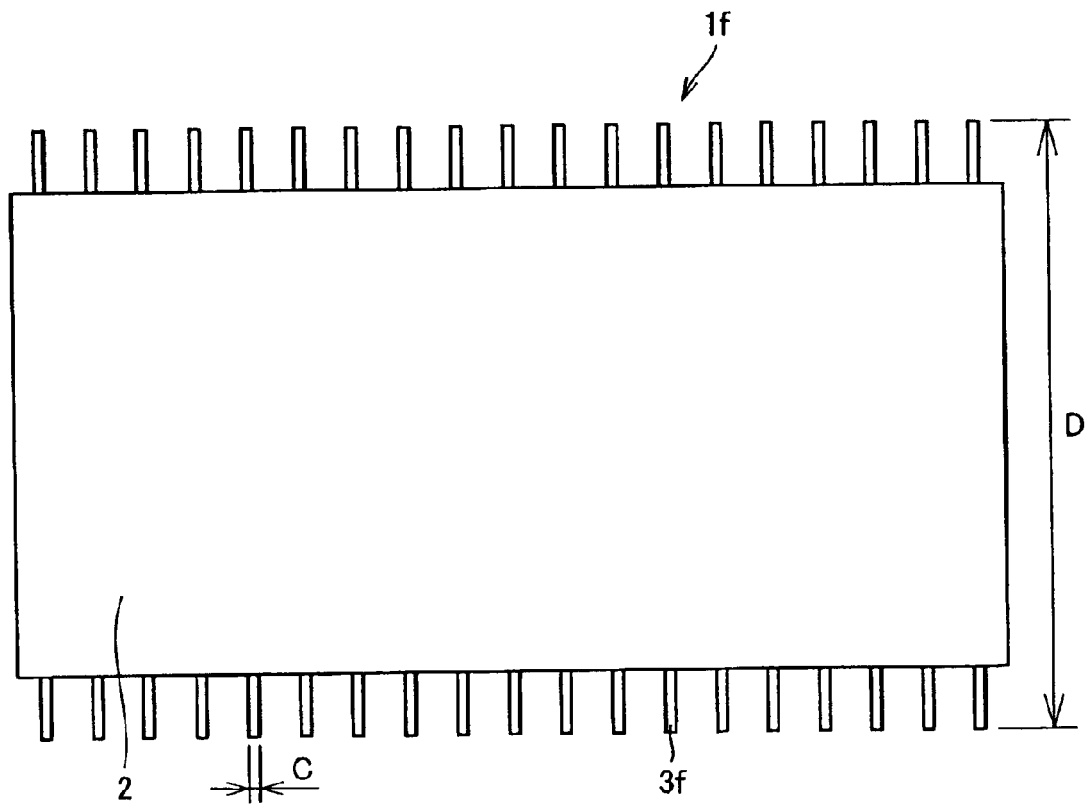
FIG. 16 is a plan view of a semiconductor package used in a third semiconductor module according to the conventional art.
Figure 17:
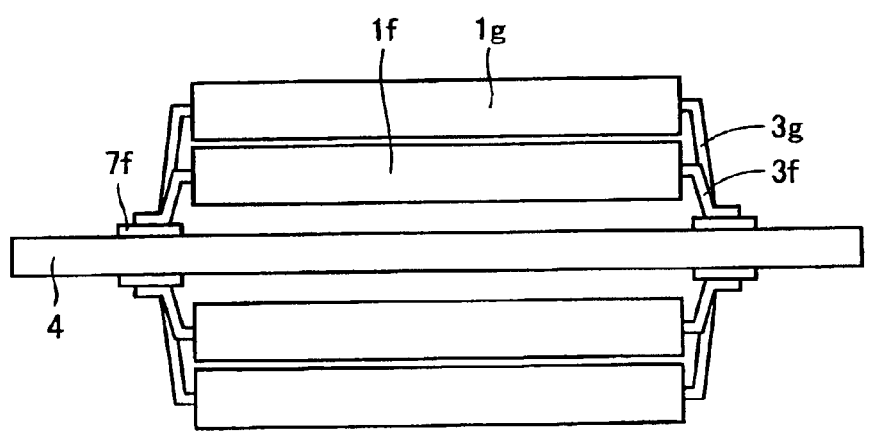
FIG. 17 is a side view of the third semiconductor module according to the conventional art.
Figure 18:
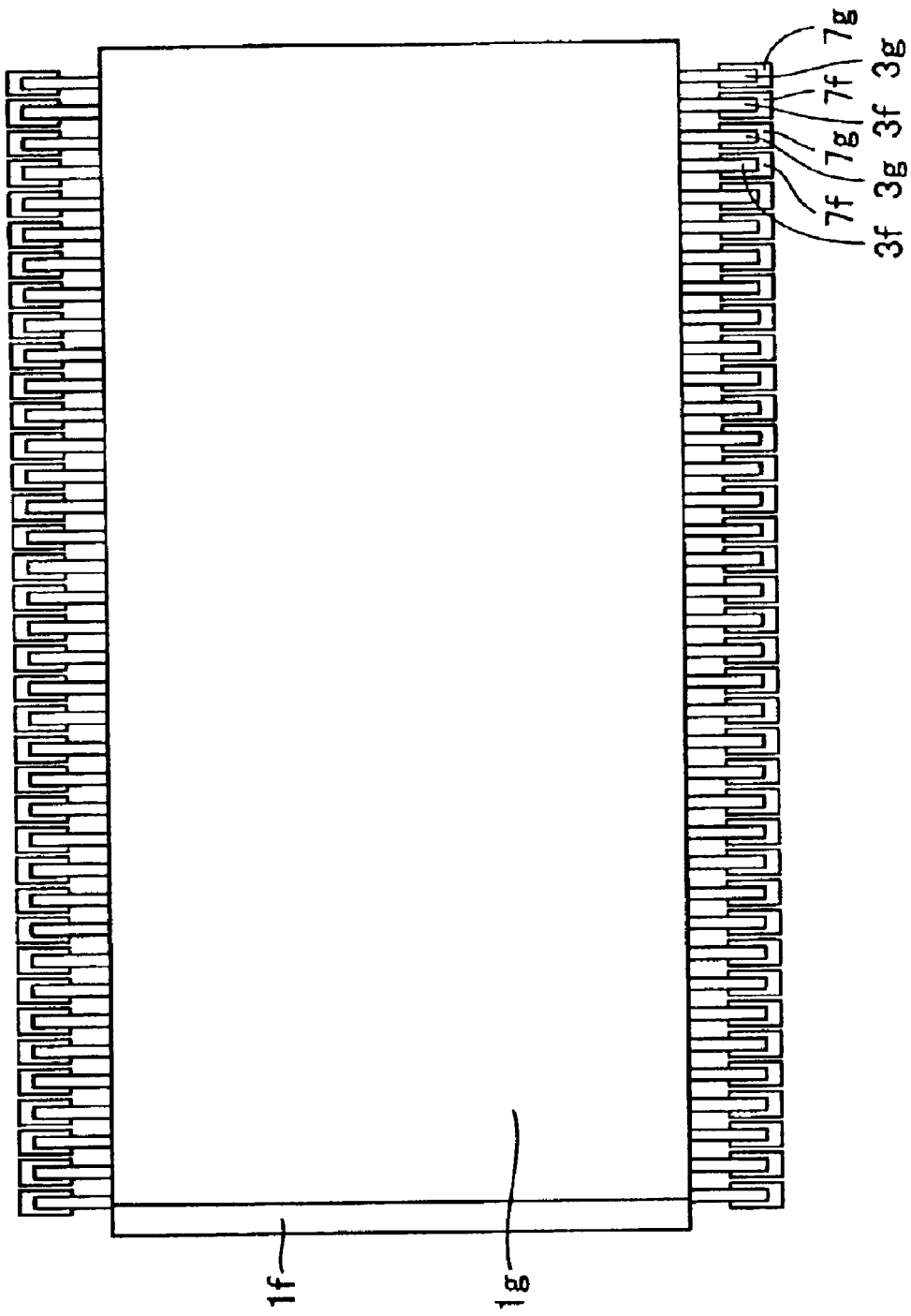
FIG. 18 is a partially enlarged plan view of the third semiconductor module according to the conventional art.
Figure 19:
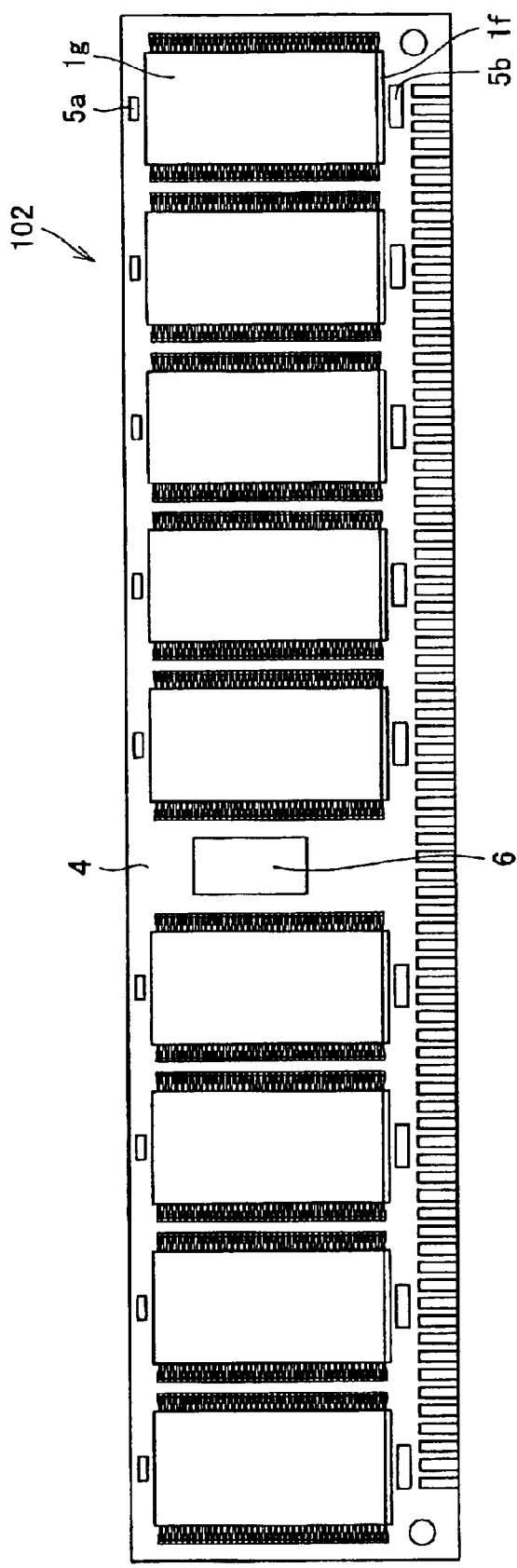
FIG. 19 is a plan view of the third semiconductor module according to the conventional art.
Figure 20:
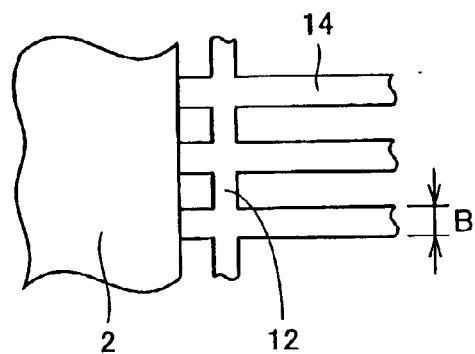
FIG. 20 is a first illustration representing a manufacturing process of a common and conventional semiconductor package.

Referring to FIGS. 1 to 4, a structure of a semiconductor module in a first embodiment according to the present invention will be described. In the semiconductor module, a semiconductor package 1*f* shown in FIG. 16 is provided as a lower layer while a semiconductor package 1*h* shown in FIG. 1 is provided as an upper layer. Semiconductor package 1*h* has a lead 3*h*, of which width C is 0.16 mm. When viewed from the top, the lead of semiconductor package 1*h* appears to be slightly longer than that of semiconductor package 1*f*. Both of the above packages are mounted on a substrate 4, as shown in FIGS. 2 and 3. When viewed in a direction of FIG. 2, lead 3*h* appears to run outside lead 3*f*. Note that a dambar residual portion is not illustrated in FIG. 2.

Figure 4:
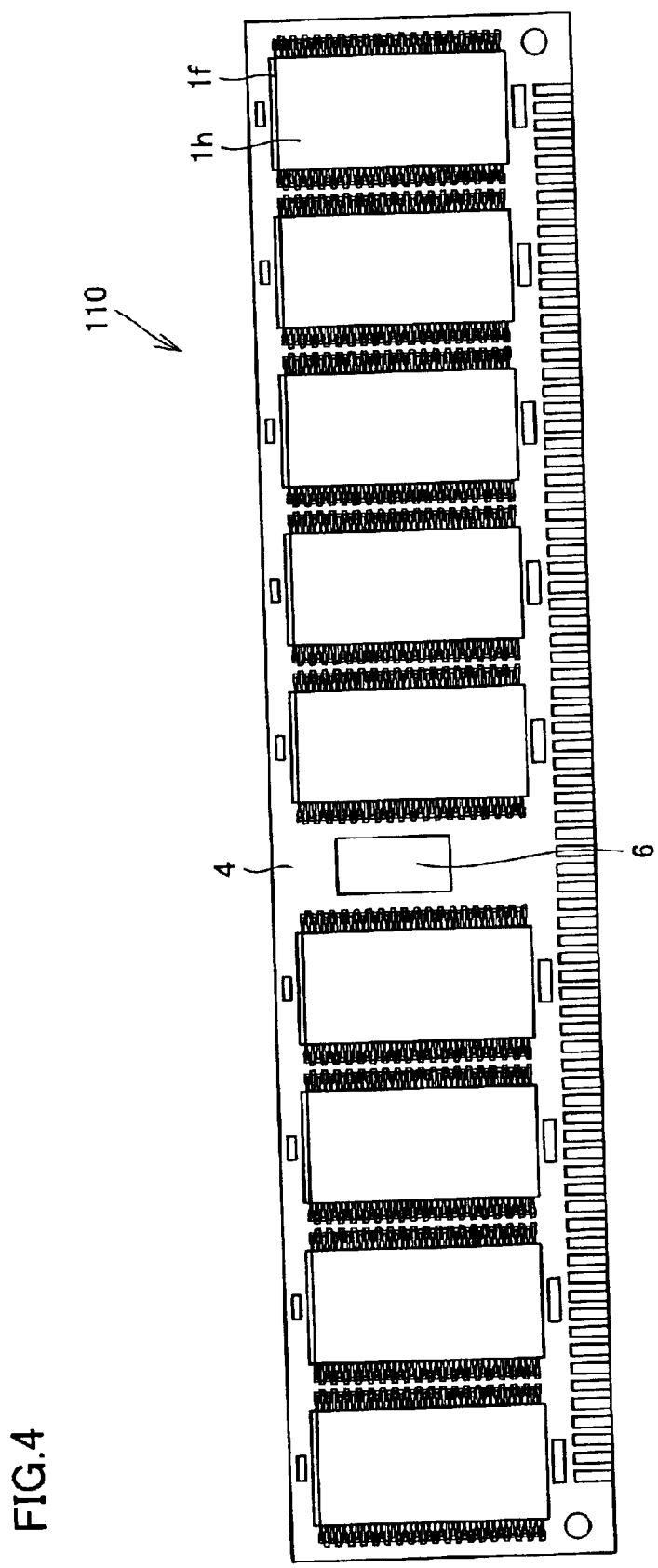
FIG. 4 is a plan view of the semiconductor module in the first embodiment according to the present invention.

As shown in FIG. 3, semiconductor package 1*f* and semiconductor package 1*h* are stacked with a displacement by 0.4 mm, which is half the lead pitch A=0.8 mm. A pad 7*f* for semiconductor package 1*f* and a pad 7*h* for semiconductor package 1*h* are arranged alternately, and at the same time, are staggered so that pad 7*h* is located outside pad 7*f*, when viewed from the package body. A memory module 110 is shown in FIG. 4 in its entirety.

Figure 13:
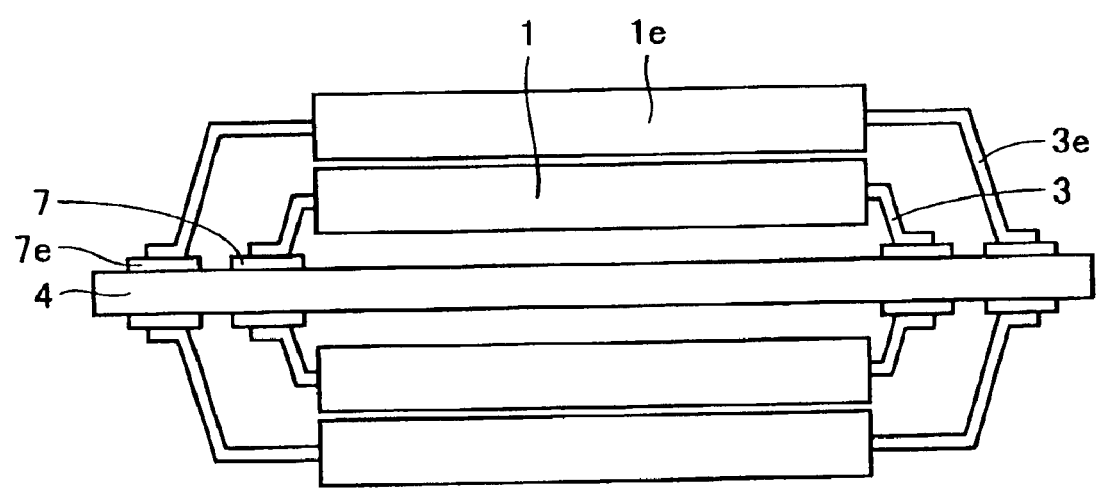
FIG. 13 is a side view of the second semiconductor module according to the conventional art.
Figure 14:
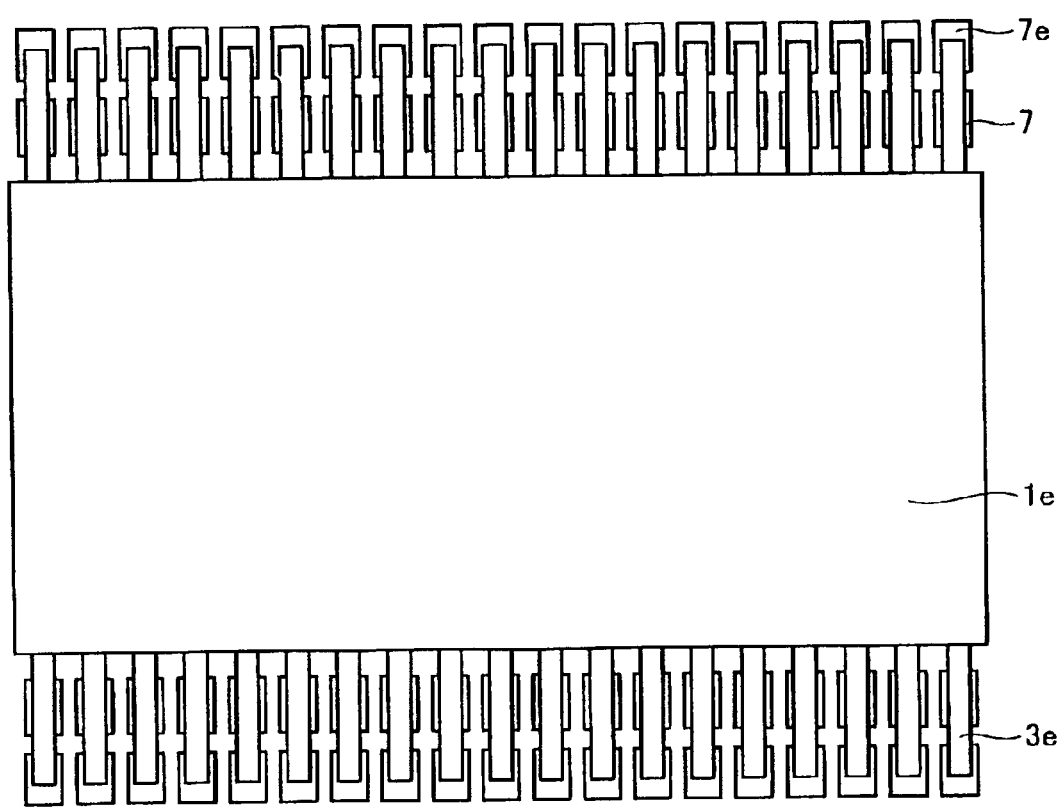
FIG. 14 is a partially enlarged plan view of the second semiconductor module according to the conventional art.
Figure 15:
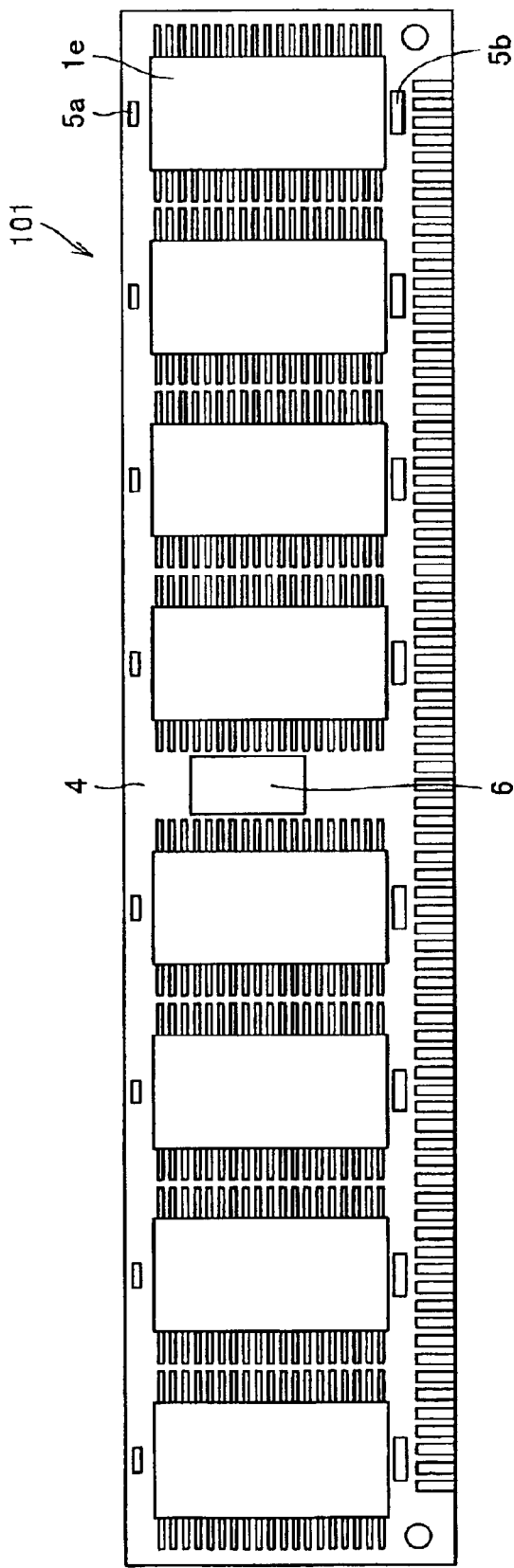
FIG. 15 is a plan view of the second semiconductor module according to the conventional art.

Pad 7*h* and pad 7*f* corresponding respectively to the upper and lower semiconductor packages are not arranged in parallel in two distant rows as shown in FIGS. 13 and 14 but arranged in an alternate combination in a staggered manner. Therefore, horizontal width of a region occupied on substrate 4 by a set of vertically stacked semiconductor packages is not as large as that shown in FIGS. 13 and 14. Thus, as shown in FIG. 4, as in a conventional example, nine semiconductor packages can be arranged per one layer on one side of one substrate 4 with a dimension determined in accordance with the conventional standard.

Figure 5:
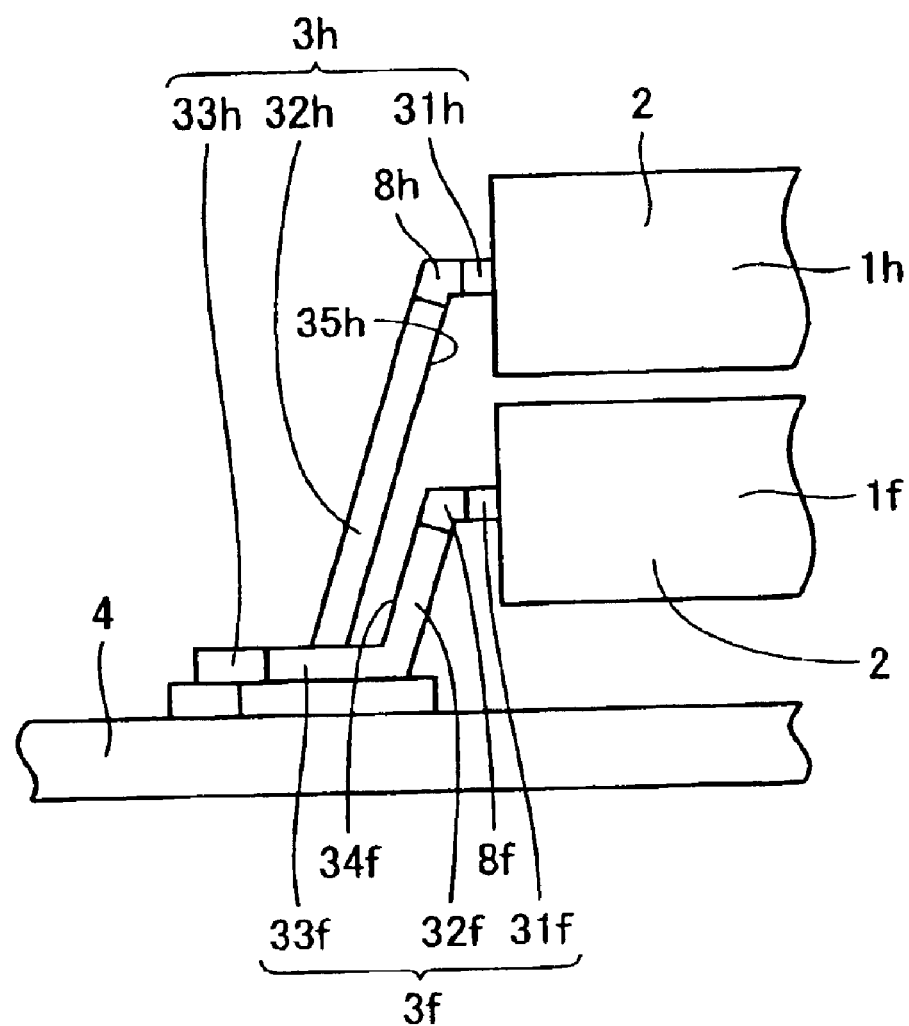
FIG. 5 is a partially enlarged side view of the semiconductor module in the first embodiment according to the present invention.

In addition, as shown in FIG. 5, assume that lead 3*h* of upper layer semiconductor package 1*h* has 3 portions, that is, a lead drawn-out portion 31*h*, a lead downward portion 32*h* and a lead foot portion 33*h*, and that lead 3*f* of lower layer semiconductor package 1*f* has 3 portions, that is, a lead drawn-out portion 31*f*, a lead downward portion 32*f* and a lead foot portion 33*f*. Here, an inner surface 35*h* of lead downward portion 32*h* of lead 3*h* is positioned outside an outer surface of lead downward 32*f* of lead 3*f*. Therefore, even if slight displacement of the relative positions of upper and lower layer semiconductor packages, with one overlying the other, may occur, contact of lead downward portion 32*h* of lead 3*h* with dambar residual portion 8*f* of lead 3*f* can be prevented.

Second Embodiment

Figure 6:
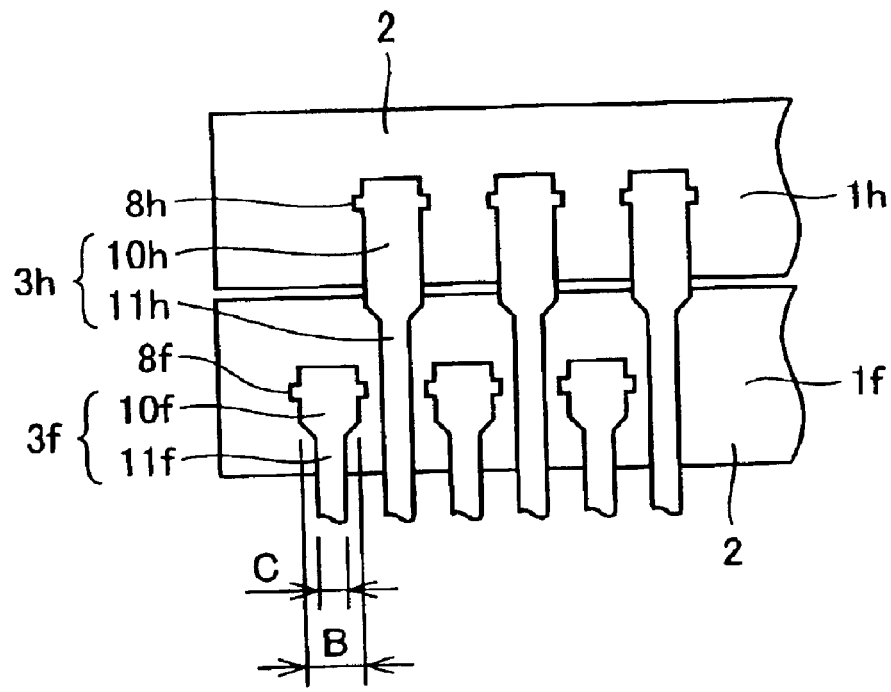
FIG. 6 is a partially enlarged side view of a semiconductor module in a second embodiment according to the present invention.

A structure of a semiconductor module in a second embodiment according to the present invention will be described. The semiconductor module has semiconductor package 1*f* mounted as a lower layer and semiconductor package 1*h* mounted as an upper layer on substrate 4, basically in a similar manner to the first embodiment, except for the shape of a lead of each semiconductor package as shown in FIG. 6. Leads 3*f*, 3*h* have wide portions 10*f*, 10*h* respectively in the vicinity of the root when viewed from package body 2. Dambar residual portions 8*f*, 8*h* are located in the middle of wide portions 10*f*, 10*h* respectively. Sides far from package body 2 of leads 3*f*, 3*h* are provided as narrow portions 11*f*, 11*h*. Width of the wide portion is 0.3 mm, which is the same as conventional lead width B, while width C of the narrow portion is 0.16 mm.

Figure 7:
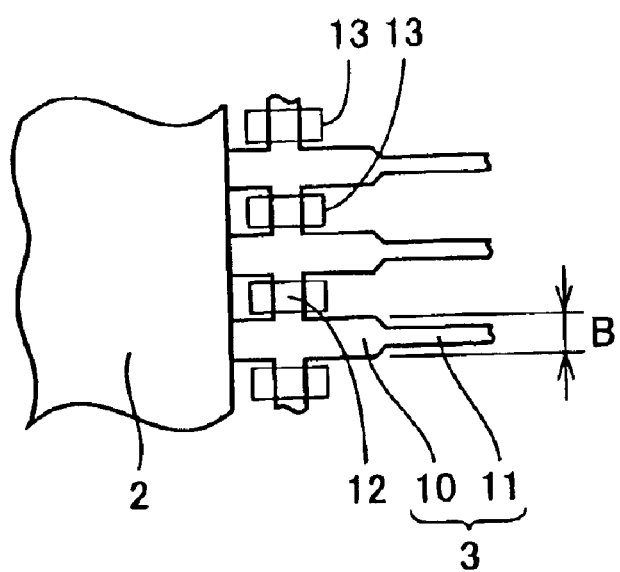
FIG. 7 shows a manufacturing process of a semiconductor package used in the semiconductor module in the second embodiment according to the present invention.
Figure 21:
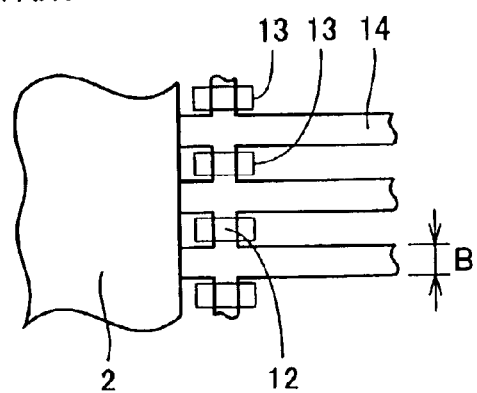
FIG. 21 is a second illustration representing the manufacturing process of the common and conventional semiconductor package.
Figure 22:
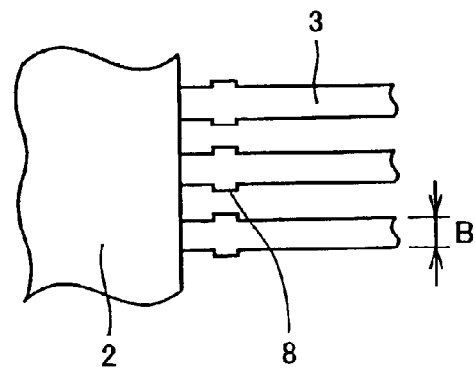
FIG. 22 is a third illustration representing the manufacturing process of the common and conventional semiconductor package.
Figure 23:
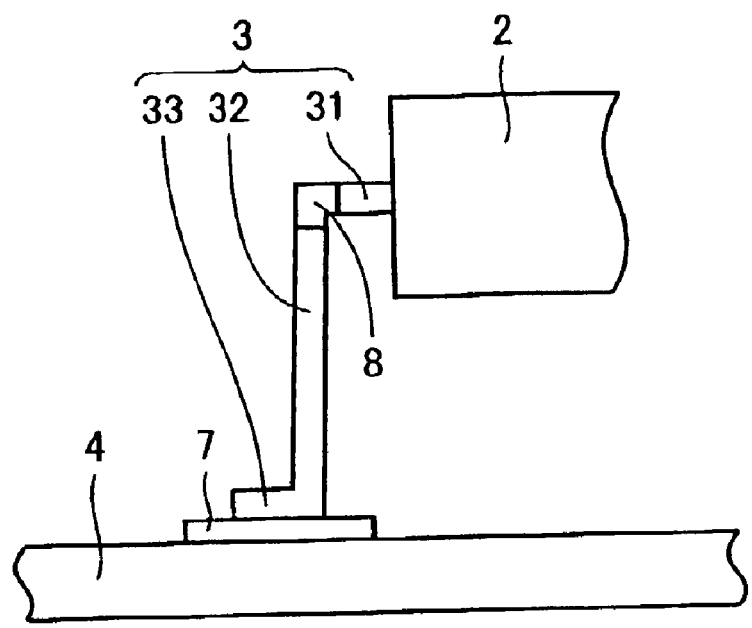
FIG. 23 is a partially enlarged side view from a first direction, of the common and conventional semiconductor package.
Figure 24:
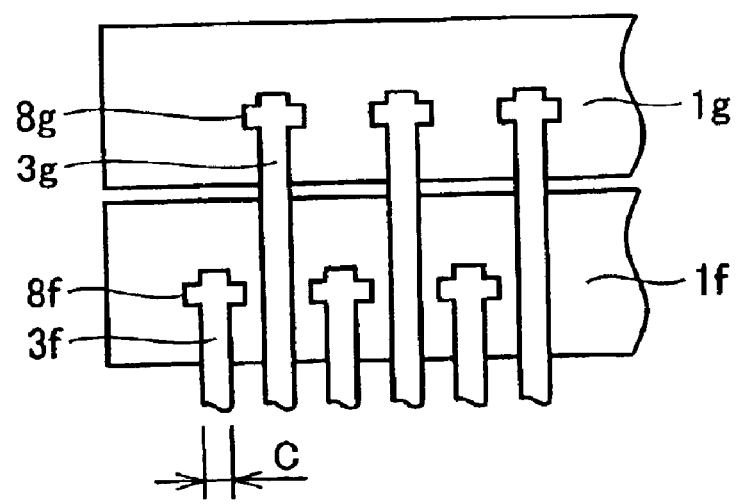
FIG. 24 is a partially enlarged side view from a second direction, of the common and conventional semiconductor package.

In addition to the effect described in the first embodiment, a portion of the lead is provided as a wide portion having the same width as the conventional lead width, whereby, the size of a region to be punched will be the same as in a conventional example (see FIG. 21), as shown in FIG. 7. Thus, a conventional punching apparatus can be used, obviating the need for a new punching apparatus. Moreover, large width at the root portion will increase the strength of the lead itself.

In the present embodiment, leads of each semiconductor package in both upper and lower layers are provided with wide portions and narrow portions. Meanwhile, only the lead of each semiconductor package in the upper layer may be provided with the wide and narrow portions while the lead of each semiconductor package in the lower layer may have the conventional width, that is, the same width as the wide portion.

Third Embodiment

Figure 8:
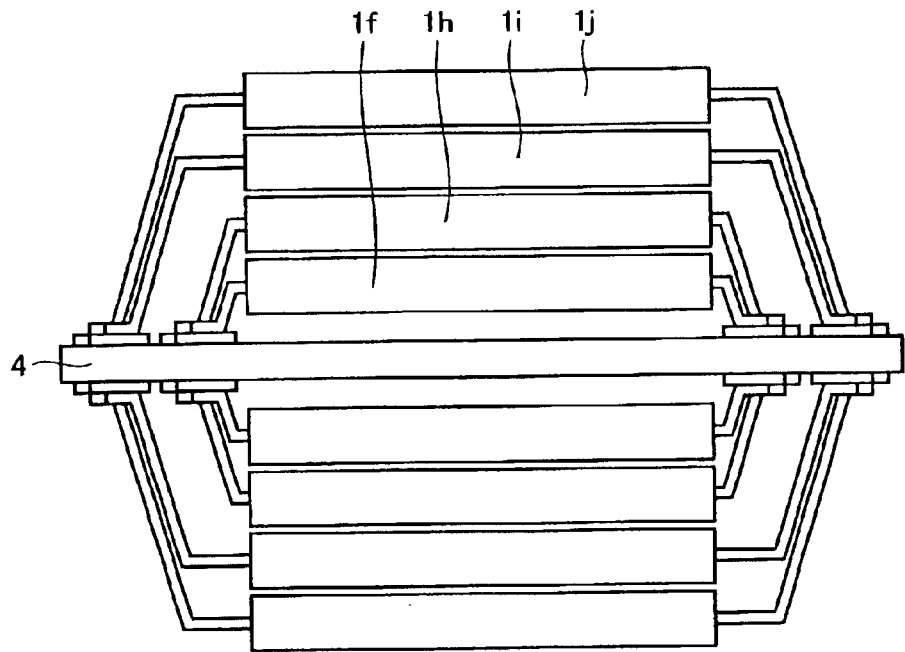
FIG. 8 is a side view of a semiconductor module in a third embodiment according to the present invention.
Figure 9:
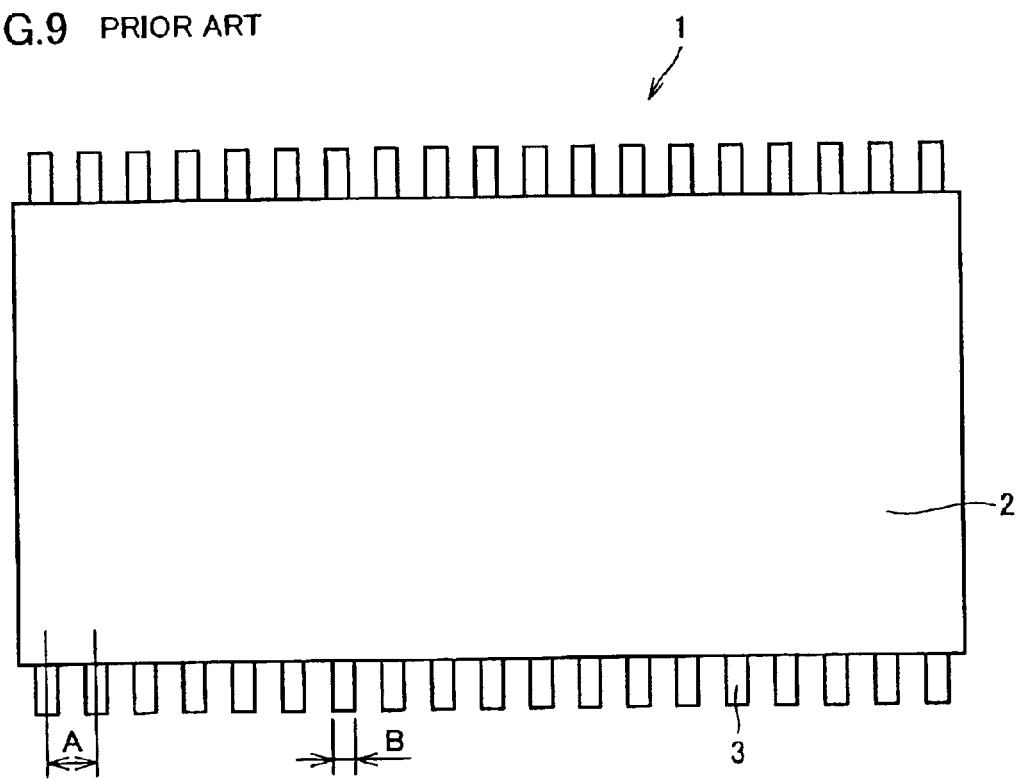
FIG. 9 is a plan view of a common and conventional semiconductor package.
Figure 10:
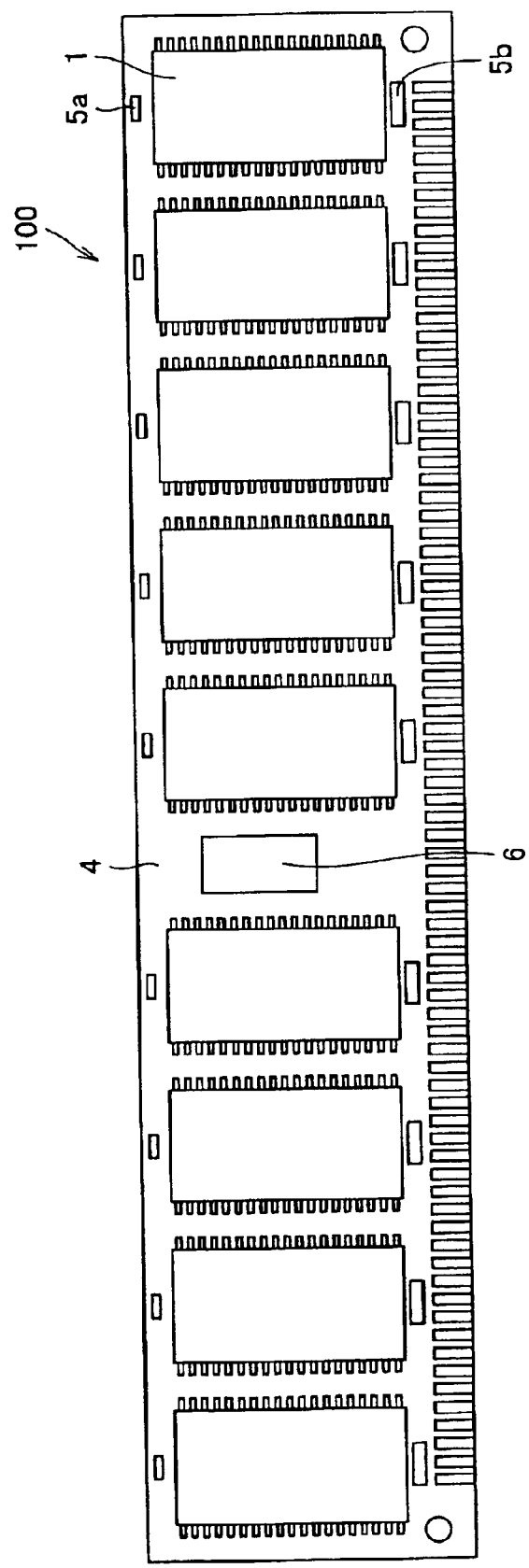
FIG. 10 is a plan view of a first semiconductor module according to a conventional art.
Figure 11:
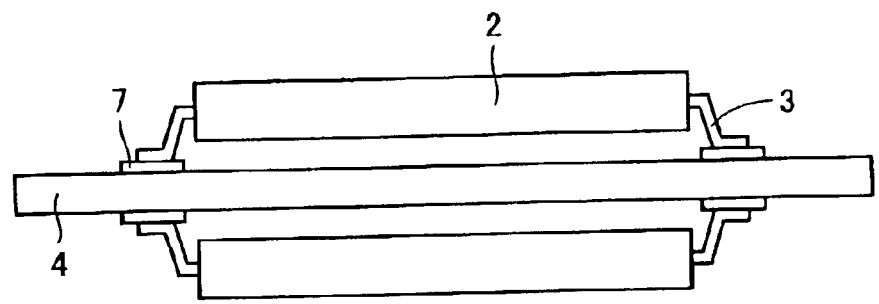
FIG. 11 is a side view of the first semiconductor module according to the conventional art.
Figure 12:
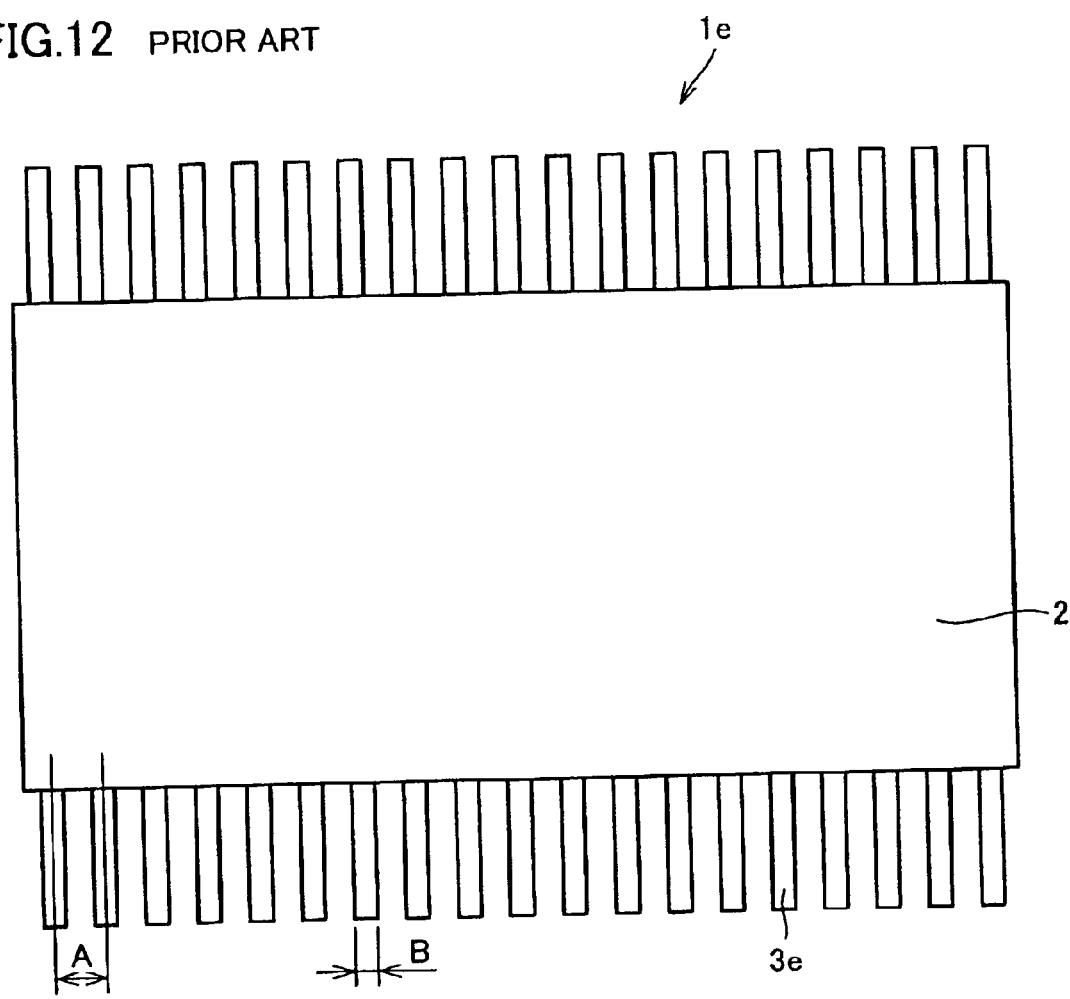
FIG. 12 is a plan view of a semiconductor package used in a second semiconductor module according to the conventional art.

Referring to FIG. 8, a semiconductor module in a third embodiment according to the present invention will be described. In the semiconductor module, based on the concept in the first and second embodiments, the number of combinations of upper and lower layer semiconductor packages are increased, and a plurality of those combinations are stacked vertically (a top-to-bottom direction in the drawing) to the main surface of the substrate. In an example of a combination mounted on one surface of substrate 4 as shown in FIG. 8, though two combinations, that is, a combination of semiconductor packages 1*h*, 1*f* and a combination of semiconductor packages 1*j*, 1*i* are stacked, three or more combinations may be stacked. Further, the semiconductor packages stacked on one surface do not always have to be a combination of upper and lower layers. For example, a stack in which semiconductor package 1*j* of FIG. 8 is absent is possible.

Thus, larger number of semiconductor packages are mounted per unit area of a substrate, and a semiconductor module of high density and high performance can be obtained. For example, if the module is a memory module, the one with a large capacity can be obtained.

According to the present invention, even if slight displacement of the relative positions of upper and lower layer semiconductor packages, with one overlying the other, may occur, contact of the lead of the upper layer semiconductor package with the dambar residual portion of the lower layer semiconductor package can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor module, comprising:
    a substrate having a plurality of pad electrodes on a first surface;
    a lower layer semiconductor package mounted on said substrate; and an upper layer semiconductor package mounted on said substrate while arranged in a position substantially overlying said lower layer semiconductor package; wherein said lower layer semiconductor package and upper layer semiconductor package include a package body, and a plurality of leads protruding in parallel respectively from opposing side portions of said package body and electrically connected to said pad electrodes, and said pad electrodes having said leads of said upper layer semiconductor package connected, and said pad electrodes having said leads of said lower layer semiconductor package connected are alternately arranged, said leads include a lead drawn-out portion horizontally drawn from a side portion of said package body, a lead downward portion extending from said lead drawn-out portion down to a surface of said substrate and a lead foot portion continuing to a tip end of said lead downward portion and contacting said pad electrode, said leads have a dambar residual portion protruding toward said lead adjacently protruding from same said package body in any position between said lead drawn-out portion and said lead downward portion, and inner surfaces of said lead downward portions of said upper layer semiconductor package are positioned outside outer surfaces of said lead downward portions of said lower layer semiconductor package, wherein said leads have a section including said dambar residual portion, wider than other sections.

2. The semiconductor module according to claim 1, wherein when viewed two-dimensionally, said pad electrodes are staggered so that said pad electrodes connected to said upper layer semiconductor package are located outside of said pad electrodes connected to said lower layer semiconductor package, with a projection region onto said substrate of said package body serving as a center.

3. The semiconductor module according to claim 1, wherein a horizontal distance from said package body to said dambar residual portion in said upper layer semiconductor package is substantially equal to a horizontal distance from said package body to said dambar residual portion in said lower layer semiconductor package, and said lead downward portions of said upper layer semiconductor package and said lower layer semiconductor package extend diagonally relative to said substrate.

4. The semiconductor module according to claim 1, further comprising a structure having a plurality of combinations of said upper layer semiconductor package and said lower layer semiconductor package vertically stacked.

5. The semiconductor module according to claim 1, further comprising a lower layer semiconductor package mounted on a second surface of said substrate opposing said first surface; and an upper layer semiconductor package mounted on said second surface of said substrate and arranged in a position substantially overlying said lower layer semiconductor package mounted on the second surface.

6. The semiconductor module according to claim 1, comprising a plurality of pairs of lower layer semiconductor packages and overlying upper layer semiconductor packages mounted on said first surface.

7. The semiconductor module according to claim 6, wherein nine pairs of lower layer semiconductor packages and overlying upper layer semiconductor packages are mounted on said first surface.

* * * * *